United States Patent
Hertkorn et al.

(10) Patent No.: US 9,337,388 B2
(45) Date of Patent: May 10, 2016

(54) METHOD FOR PRODUCING A SEMICONDUCTOR LAYER SEQUENCE, RADIATION-EMITTING SEMICONDUCTOR CHIP AND OPTOELECTRONIC COMPONENT

(75) Inventors: Joachim Hertkorn, Alteglofsheim (DE); Tetsuya Taki, Tokyo (JP); Jürgen Off, Regensnburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 211 days.

(21) Appl. No.: 13/878,212

(22) PCT Filed: Sep. 30, 2011

(86) PCT No.: PCT/EP2011/067154
§ 371 (c)(1),
(2), (4) Date: Jun. 17, 2013

(87) PCT Pub. No.: WO2012/049031
PCT Pub. Date: Apr. 19, 2012

(65) Prior Publication Data
US 2013/0264598 A1    Oct. 10, 2013

(30) Foreign Application Priority Data
Oct. 15, 2010  (DE) .......................... 10 2010 048 617

(51) Int. Cl.
*H01L 21/00*  (2006.01)
*H01L 33/24*  (2010.01)
(Continued)

(52) U.S. Cl.
CPC ............ *H01L 33/24* (2013.01); *H01L 33/0079* (2013.01); *H01L 33/22* (2013.01); *H01L 33/007* (2013.01); *H01L 33/16* (2013.01); *H01L 2924/0002* (2013.01)

(58) Field of Classification Search
None
See application file for complete search history.

(56) References Cited

U.S. PATENT DOCUMENTS 7,897,423 B2 * 3/2011 Hahn ...................... H01L 33/22
257/E21.122
2005/0104081 A1  5/2005 Kim et al.
(Continued)

FOREIGN PATENT DOCUMENTS

CN    101427391 A    5/2009
DE    698 31 419 T2   6/2006
(Continued)

OTHER PUBLICATIONS

Pearton, S.J., et al., "Recent progress in processing and properties of ZnO," Progress in Materials Science, vol. 50, 2005, pp. 293-340.
(Continued)

*Primary Examiner* — Ali Naraghi
(74) *Attorney, Agent, or Firm* — Slater & Matsil, L.L.P.

(57) ABSTRACT

A method can be used for producing a semiconductor layer sequence, which is based on a nitride compound semiconductor material and which comprises a microstructured outer surface. The method has the following steps: A) growing at least one first semiconductor layer of the semiconductor layer sequence on a substrate; B) applying an etch-resistant layer on the first semiconductor layer; C) growing at least one further semiconductor layer on the layer sequence obtained in step B); D) separating the semiconductor layer sequence from the substrate, a separating zone of the semiconductor layer sequence being at least partly removed; E) etching the obtained separating surface of the semiconductor layer sequence by an etching means such that a microstructuring of the first semiconductor layer is carried out and the microstructured outer surface is formed.

7 Claims, 5 Drawing Sheets

(51) Int. Cl.
*H01L 33/22* (2010.01)
*H01L 33/00* (2010.01)
*H01L 33/16* (2010.01)

(56) References Cited

U.S. PATENT DOCUMENTS

2005/0217565 A1  10/2005  Lahreche et al.
2008/0135856 A1   6/2008  Moon
2010/0133658 A1*  6/2010  Dadgar .................. C30B 25/02
                                                                257/615

FOREIGN PATENT DOCUMENTS

| DE | 10 2005 047 152 A1 | 4/2007 |
| EP | 1 577 958 A1 | 9/2005 |
| WO | WO 98/14986 A1 | 4/1998 |
| WO | WO 2005/106972 A1 | 11/2005 |
| WO | WO 2007/096405 A1 | 8/2007 |

OTHER PUBLICATIONS

Schnitzer, I., et al., "30% external quantum efficiency from surface textured, thin-film light-emitting diodes," Applied Physics Letters, No. 63, vol. 15, Oct. 18, 1993, 3 pages.

Schnitzer, I., et al., "30% external quantum efficiency from surface textured, thin-film light-emitting diodes," Applied Physics Letters, vol. 63, No. 16, Oct. 18, 1993, pp. 2174-2176.

First Office Action received in CN 201180049670.7, mailed Mar. 2, 2015, 15 pages.

* cited by examiner

METHOD FOR PRODUCING A SEMICONDUCTOR LAYER SEQUENCE, RADIATION-EMITTING SEMICONDUCTOR CHIP AND OPTOELECTRONIC COMPONENT

This patent application is a national phase filing under section 371 of PCT/EP2011/067154, filed Sep. 30, 2011, which claims the priority of German patent application 10 2010 048 617.5, filed Oct. 15, 2010, each of which is incorporated herein by reference in its entirety.

TECHNICAL FIELD

The invention relates to a method for producing a semiconductor layer sequence, in particular a semiconductor layer sequence for a radiation-emitting semiconductor chip, for example, a thin-film light-emitting diode chip, and to the radiation-emitting semiconductor chip produced by the method and to an optoelectronic component comprising a radiation-emitting semiconductor chip of this type.

BACKGROUND

In order to increase the extraction efficiency of nitride-based LEDs and in order to produce a microstructured surface of a semiconductor layer sequence required therefor, a roughening step by means of an etching medium is often carried out after a laser lift-off step at the obtained surface of the semiconductor layer sequence. However, there is a need to further improve the extraction efficiency of semiconductor layer sequences obtained in this way.

SUMMARY OF THE INVENTION

In one aspect, the present invention specifies a method and a structured semiconductor layer sequence produced thereby in which the extraction efficiency of the radiation-emitting semiconductor layer sequence is improved by comparison with the prior art and/or fewer semiconductor layer sequences that are not suitable or are only poorly suitable for the desired use are obtained.

The method according to the invention relates to the production of a semiconductor layer sequence which has a microstructured outer surface and is based on nitride compound semiconductor material. It comprises the following steps:
A) initially a first semiconductor layer of the semiconductor layer sequence is grown on a substrate;
B) subsequently, an etching stop layer is applied to said first semiconductor layer;
C) at least one further semiconductor layer is grown on the layer sequence obtained in step B);
D) the semiconductor layer sequence is separated from the substrate by a separating zone of the semiconductor layer sequence being at least partly removed (i.e. in particular decomposed or destroyed);
E) the separating surface of the semiconductor layer sequence produced by the separating step is subjected to an etchant, such that one microstructuring of the first semiconductor layer, in particular of the outer surface of the first semiconductor layer, is effected and the microstructured outer surface of the semiconductor layer sequence is formed in this case.

In accordance with the application, "based on nitride compound semiconductor material" means that the semiconductor layer sequence, which is produced epitaxially, in particular, and which regularly has a layer sequence composed of a plurality of different individual layers, contains at least one individual layer comprising a material composed of nitride compound semiconductor material. In particular, the layer having the microstructured outer surface comprises or consists of said material; furthermore, an active layer contained in the semiconductor layer sequence can also comprise or consist of a nitride compound semiconductor material. In accordance with one embodiment, it is also possible for all layers of the semiconductor layer sequence—apart from the etching stop layer—to consist of or comprise the nitride compound semiconductor material.

In accordance with the application, microstructured means that elevations and depressions are situated at least in regions on the microstructured surface, i.e., the outer surface of the semiconductor layer sequence. This microstructuring is produced chemically, in particular, to be precise in particular by virtue of the fact that, by means of a chemical reaction, structures are introduced into the surface to be structured, or—if structures are already present in the surface to be structured—to produce a structure profile in which in this regard higher elevations and/or deeper depressions are present. The microstructures can be embodied in a relief- or trench-like fashion; in particular, however, a structure which is substantially based on regular polyhedron structures or structures derived from polyhedra can be involved. In particular, such polyhedra can be present in different sizes (that is to say that the individual polyhedra have different volumes) or else with substantially identical sizes. "Structures derived from polyhedra" are understood to be, in particular, structure elements in which the tip facing away from the semiconductor layer sequence is embodied in the manner of a polyhedron, but not a base surface facing the etching stop layer or the interface with adjacent structure elements.

The microstructuring method according to the application is based on the fundamental concept that, after the semiconductor layer sequence has been grown epitaxially on a growth substrate largely optimized with regard to the growth conditions and after the etching stop layer has been applied in the meantime, the semiconductor layer sequence is separated from the growth substrate. This separation is effected in a separating zone of the semiconductor layer sequence, which is at least partly removed, in particular decomposed. Afterward, the microstructuring of the surface obtained during separation is then effected. According to the invention, it has now been recognized that as a result of introducing an etching stop layer which directly adjoins the first semiconductor layer etched in the later microstructuring step, the microstructuring can be carried out more efficiently and, moreover, fewer rejects are produced. According to the prior art, for a given semiconductor layer sequence system, the roughening times firstly have to be determined experimentally in order, on the one hand, to be able to produce the desired coupling-out structures, in particular crystal facets, to the greatest possible extent and thus to obtain a particularly high extraction efficiency, but on the other hand to choose the etching duration such that the layers which adjoin the semiconductor layer of the semiconductor layer sequence that is provided for microstructuring are not likewise etched by the etching medium. This last can ultimately lead—in particular if the active zone of the semiconductor layer sequence is affected by contact with the etchant—to short circuits and thus to the total failure of a component or of a semiconductor layer sequence.

The etching stop layer provided according to the invention therefore constitutes a targeted safeguard against an excessively high degree of etching of the semiconductor layer sequence, by means of which, in particular, etching of layers other than the first layer of the semiconductor layer sequence can be prevented or at least greatly reduced. Consequently, the proportion of non-functional components or semiconductor layer sequences can also be significantly reduced, even though the length of the roughening time (or the time of action of the etching medium) can be chosen such that, as a result of the microstructuring produced in this case (or the radiation coupling-out structure), the extraction efficiency of the component is optimal. Relative to the total number of semiconductor layer sequences produced simultaneously, a better yield is established by virtue of the smaller proportion of non-functional components, to be precise even when the extraction efficiency of the individual radiation-emitting semiconductor layer sequence is not increased by comparison with a semiconductor layer sequence produced according to the prior art.

In accordance with one embodiment of the method according to the application, the nitride compound semiconductor material has the chemical formula $In_xAl_yGa_{1-x-y}N$ wherein $0 \leq x \leq 1$, $0 \leq y \leq 1$ and $x+y \leq 1$. In this case, this material need not necessarily have a mathematically exact composition according to the above formula. Rather, it can comprise, for example, one or more dopants and additional constituents. For the sake of simplicity, however, the above formula only includes the essential constituents of the crystal lattice (Al, Ga, In, N), even if these can be replaced and/or supplemented in part by smaller amounts of further substances. By way of example, one or more layers of the semiconductor layer sequence can be formed from the compound semiconductor material AlGaInN. This semiconductor material is suitable, in particular, for light-emitting diodes which emit electromagnetic radiation in the ultraviolet to blue spectral range. In order to generate white light, part of the emitted primary radiation can be converted into a radiation having a longer wavelength by means of a luminescence conversion substance, such that white light, for example, arises as a result of the mixing of primary radiation and the secondary radiation thus generated.

The semiconductor layer sequence according to the application can have, for example, a conventional pn junction, a double heterostructure, a single quantum well structure (SQW structure) or a multiple quantum well structure (MQW structure). In this case, the designation quantum well structure encompasses, in particular, any structure in which charge carriers can experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures.

In accordance with one embodiment, the first layer of the semiconductor layer sequence (i.e., the layer which is later structured by means of the etchant) comprises or consists of $In_xGa_{1-x}N$, wherein $0 \leq x \leq 1$, and can consist of or comprise gallium nitride, for example. Gallium nitride GaN and indium gallium nitride $In_xGa_{1-x}N$ are particularly well suited in particular since particularly good results are obtained with these materials with regard to stress compensation and subsequent application of the etching stop layer, for example, of a ceramic etching stop layer composed of silicon nitride.

The etching stop layer used according to the invention is formed, in particular, from a conductive material.

In particular, the material of the etching stop layer is a material which is substantially not attacked by the etchant, in particular a wet-chemical etchant such as KOH solution, for example. In this case, "substantially not attacked" can mean that the rate at which the etching stop layer is removed by the etchant, in particular a wet-chemical etchant, is lower at least by the factor 20, but usually at least by the factor 100, then the rate at which the semiconductor material of the first layer of the semiconductor layer sequence is removed. In particular, this should be understood to mean the rate of removal of $In_xGa_{1-x}N$ in the region of the crystal defects or amorphous structures (that is to say, in particular, up to the formation of crystal facets), which can be approximately in the range of 200-300 nm per minute, but is dependent on the temperature. Such a stipulation can be fulfilled for example by ceramic materials, for instance, metal or semimetal oxides or nitrides. If the thickness of the etching stop layer is thin enough, then ceramic materials such as, e.g., silicon oxide also satisfy the stipulation of conductivity (in a lateral direction; that is to say transversely with respect to the layer stack of the semiconductor layer sequence).

The etching stop layer can comprise or consist of, for example, silicon nitride, silicon dioxide and/or magnesium nitride. However, this should not be understood to mean only the materials having exact stoichiometry of silicon, magnesium, nitrogen and oxygen; rather, materials having an incompletely stoichiometric structure also come under the term silicon nitride, silicon oxide and magnesium nitride.

The ceramic etching stop layers can be applied, in particular, in situ during an epitaxy method for producing the remaining layers of the semiconductor layer sequence. By way of example, in this case a silicon nitride layer can be produced by using a silane (for example, $SiH_4$) and ammonia, and a magnesium nitride layer by using $Cp_2Mg$ and an $N_2$ source to which $O_2$ is added. Silicon oxide layers and layers composed of other ceramic materials can also be obtained correspondingly.

In accordance with a further embodiment, the etching stop layer has a thickness which is less than or equal to 5 nm. In particular, the thickness can in this case be greater than or equal to 0.2 nm and can be, for example, 0.4 to 2 nm. A layer thickness of up to 1 nm will often be expedient. It is ensured in particular by means of such a layer thickness that "etching through the first semiconductor layer of the semiconductor layer sequence" and an adjoining layer is effectively prevented, at the same time the lateral conductivity is maintained, and finally (in particular in the case of layers composed of silicon nitride, silicon oxide and magnesium nitride) problem-free growth of the further semiconductor layer(s) in accordance with step C) of the method according to the application is possible. This can be seen, in particular, on the one hand against the background that the "first layer" (before the etching step is carried out) can often have a thickness of up to 5 μm, and on the other hand against the background that the duration of action of the etching medium is often approximately 5 to 20 minutes, for example, approximately 10 minutes. The layer thickness in accordance with this embodiment therefore ensures that at locations at which, e.g., on account of a particularly high crystal defect density, the "first layer" is removed relatively rapidly by the etchant, the thickness of the etching stop layer can effectively prevent incipient etching of the further layers of the semiconductor layer sequence.

According to the application, the thickness of the etching stop layer is understood to be the mean or average thickness of the etching stop layer, which can be determined, for example, by means of the evaluation of TEM micrographs (transmission electron microscope micrographs) of a layer sequence segment obtained by means of a lateral section through the layer sequence. During the method, the layer thickness can be influenced to the effect that the time of action of the precursor materials used for the etching stop layer is correspondingly set on the basis of empirical examinations.

In the semiconductor layer sequence obtained by the method according to the application, the etching stop layer formed on the first layer covers the underlying first layer generally completely or largely completely. In this case, largely completely is understood to mean that at least 70% of the first layer is covered by the etching stop layer. However, it is also possible for more than 90%, for example, more than 98%, of the first layer to be covered. If complete coverage is not present, then the regions of the first layer which are not covered by the etching stop layer are generally distributed irregularly over the interface. The size of the regions that are not covered by the etching stop layer also varies in this case.

The cause of such an incompletely covering etching stop layer can reside in the method of application, which, if it is performed in situ during the epitaxy of the semiconductor layer sequence (unlike, for example, in the case of a method of application by means of atomic layer deposition), does not produce layers having a substantially uniform layer thickness, but rather permits relatively large fluctuation ranges and accordingly, in the case of a sufficiently small layer thickness, can also lead to regions in which no layer is produced. If the intention is to produce a complete layer having a substantially identical layer thickness, then this can be produced, however, by means of atomic layer deposition (ALD) or else by metal organic vapor phase epitaxy (MOVPE) with deposition durations of corresponding length.

The degree of coverage of the first layer with the etching stop layer can be determined, for example, by the fact that, in the case of a finished semiconductor layer sequence, first the (microstructured) first layer is largely removed or thinned by means of a mechanical method and the residual layer having a thickness of 100 nm, for example, is subsequently removed completely by means of the etching medium from step E). What can thereby be achieved is that the time of action of the etching medium on the semiconductor layer sequence can be so short that although the remaining residues of the first layer of the semiconductor layer sequence are removed, the adjoining etching stop layer is only insignificantly attacked.

The formation of regions which are free of the etching stop layer and which are regular with regard to size and arrangement can be achieved by means of photolithographic methods. However, this requires that the application of the etching stop layer and the introduction of the regions which are free of the etching stop layer cannot be effected in situ by the epitaxial method, rather that the corresponding steps have to be carried out ex situ. Accordingly, such a method is also more complex.

The presence of regions which are free of the etching stop layer can be advantageous in particular against the background that the further layers of the semiconductor layer sequence that are applied in method step C) can be epitaxially grown better on that surface of the first layer of the semiconductor layer sequence which is exposed in these regions and the complete layer succeeding the etching stop layer can be obtained more rapidly by means of epitaxial lateral overgrowth (ELO). However, it has been recognized according to the invention that the presence of regions which are free of the etching stop layer is not a prerequisite for the growth of the further layers of the semiconductor layer sequence, rather that this is also accomplished in the case of complete coverage of the first layer. The overgrowth of a completely closed silicon nitride layer can be effected, for example, without any problems by using AlGaN or AlN or other aluminum-containing layers, but overgrowth using layers which do not contain aluminum is also possible.

In accordance with the application, a sapphire substrate is usually used as the growth substrate. This is readily transmissive for electromagnetic radiation in a large wavelength range, which is of importance, for example, with regard to separating step D) and with regard to the decomposition of material of the separating zone, for example, composed of gallium nitride or indium gallium nitride. Alternatively, however, the growth substrate can also be formed from a different material, for example, also silicon carbide or silicon.

Before applying the first layer of the semiconductor layer sequence, it is possible to apply a buffer layer to the substrate. Such a buffer layer can serve to produce an optimum growth surface for subsequently growing the layers of the semiconductor layer sequence. It can serve, in particular, to compensate for differences between the lattice constants of the substrate and of the semiconductor layer sequence and also crystal defects of the substrate.

The separating zone that is at least partly removed, in particular decomposed, in step D) is either part of the first layer of the semiconductor layer sequence or constitutes a dedicated separating layer arranged between the first layer and the substrate or a buffer layer possibly present. It can also form at least part of the buffer layer. In general, the separating zone comprises or consists of nitride compound semiconductor material, wherein the nitride compound semiconductor material is usually decomposed in such a way that gaseous nitrogen arises.

For this purpose, a laser lift-off method (also called laser lift-off for short) is particularly preferably suitable as separating method. An ion implantation in which, for example, $H^+$ ions or noble gas ions are introduced into the separating zone, said ions subsequently forming small gas bubbles and, after a thermal treatment, larger bubbles allowing separation of the substrate, is also possible. Residues of a constituent of the separating layer, in particular of a metallic constituent of the separating layer, often remain anisotropically at the separating surface during the separating methods.

In accordance with one embodiment, the semiconductor layer sequence can have at the separating surface an increased defect density in comparison with part of the semiconductor layer sequence which is disposed downstream of the separating surface from the point of view of the substrate.

The separating zone often consists of gallium nitride or comprises substantially only gallium nitride. Residues of metallic Ga then often remain anisotropically on the separating surface of the semiconductor layer sequence.

If residues remain on the separating surface of the semiconductor layer sequence, then they can be completely or at least largely removed by means of a pre-etching step carried out before the step E). Such a pre-etching step can be carried out in a material-removing manner, for example, using the residues as an etching mask for a dry-etching method, by means of a gaseous etchant or by means of a wet-chemical etchant. Preferably, in this case the residues are at least largely eliminated at the same time. After the separating step, said residues initially remain on the separating surface as continuous, island-like or net-like layer or structures.

In such an optional pre-etching step, depending on the layer thickness of the residues, regions of the semiconductor layer sequence can also already be etched to different extents, such that a reckoning of the separating surface of the semiconductor layer sequence already arises as a result. The method according to the invention now has the advantage that even in the region in which residues are initially present, an optimum formation of an etching structure can be obtained without, in the regions in which no residues were present from the start, the etching being so extensive that the first semiconductor layer of the semiconductor layer sequence is completely removed and the subsequent layer is therefore affected by the etching medium.

The pre-etching step can also be obviated if, when the semiconductor layer sequence is separated from the growth substrate, only insignificant residues remain on the separating surface or they can be removed anyway by means of the etchant in accordance with step E) without significantly influencing the microstructuring intended thereby.

In accordance with one embodiment, in method step E), different crystal facets are exposed by the etching of the first layer of the semiconductor layer sequence. This can be effected, in particular, when an attack by the etchant takes place predominantly at crystal defects and, consequently, different crystal facets are etched selectively. In this case, the etchant can be, in particular, wet-chemical or gaseous and comprise an acid or a base. The gaseous etchant can be a corrosive gas such as hydrogen or chlorine, which can be used, for example, at elevated temperatures. In particular aqueous alkali hydroxide, for example, KOH, is appropriate as wet-chemical etchant. Alkali hydroxides are particularly preferred as etchant.

The crystal facets formed can form a pyramidal structure, in particular. The outer surface of the semiconductor layer sequence then has a structure which is formed by a multiplicity of pyramidal elevations. In this case, a pyramidal elevation is a polyhedron bounded by a lateral surface, a bottom surface and a top surface. The lateral surface has at least three side faces which converge and laterally bound the top surface. Structures which are derived from ideal pyramids and which have no top surfaces and consist only of lateral and bottom surfaces are often present. Furthermore, the bottom surface of the pyramids is often hexagonal. The side faces of the pyramidal elevation therefore run toward the bottom surface, which in turn faces the etching stop layer. The pyramidal structure is usually also characterized in that the tip is indeed embodied in the manner of a pyramid, but not the base surface facing the etching stop layer or the interface with adjacent pyramids.

In accordance with one embodiment, the method can be carried out, in particular, such that the nitride compound semiconductor material is applied such that the 000-1 crystal face, i.e., the N-face of the nitride lattice, faces the substrate. During the etching step, therefore, the N-face of the semiconductor layer sequence is also etched, which is possible by means of alkali hydroxide, for instance. The Ga-face of the lattice is not affected or is only insignificantly affected during such an etching step.

In accordance with a further embodiment, a mirror layer can be applied to the epitaxially grown semiconductor layer sequence. In the case of a radiation-emitting semiconductor layer sequence, by means of such a mirror layer, at least part of the electromagnetic radiation generated can be reflected back into the semiconductor layer sequence. By means of such a mirror layer, therefore, the efficiency of a radiation-emitting semiconductor layer sequence can be increased by radiation being deflected in the direction of the light coupling-out surface, i.e., the microstructured outer surface. The mirror layer can be applied before or after the microstructuring and before or after the separation of the substrate.

An electromagnetic-radiation-emitting semiconductor chip produced according to the method according to the invention comprises at least one epitaxially produced semiconductor layer sequence which comprises an n-conducting semiconductor layer, a p-conducting semiconductor layer and a region which is arranged between these layers and which can generate electromagnetic radiation during operation. The semiconductor layer sequence furthermore has a microstructured outer surface and an etching stop layer adjoining that surface of the radiation coupling-out layer which faces the region which generates electromagnetic radiation. In this case, at least one of the semiconductor layers contains a nitride compound semiconductor material.

The radiation-emitting semiconductor chip can furthermore comprise one or more features described above with respect to the method.

In particular, a thin-film light-emitting diode chip is appropriate as radiation-emitting semiconductor chip. A thin-film light-emitting diode chip is distinguished, in particular, by the following characteristic features:

a reflective layer is applied or formed at a first main surface—facing toward a carrier element—of a radiation-generating epitaxial layer sequence, said reflective layer reflecting at least part of the electromagnetic radiation generated in the epitaxial layer sequence back into the latter;

the epitaxial layer sequence has a thickness in the range of 20 µm or less, in particular in the range of 10 µm; and the epitaxial layer sequence contains at least one semiconductor layer having at least one surface having an intermixing structure which ideally leads to an approximately ergodic distribution of the light in the epitaxial layer sequence, that is to say that it has an as far as possible ergodically stochastic scattering behavior.

A basic principle of a thin-film light-emitting diode chip is described, for example, in I. Schnitzer, et al., Appl. Phys. Lett. 63 (16), Oct. 18, 1993, 2174-2176, the disclosure content of which in this respect is hereby incorporated by reference.

A thin-film light-emitting diode chip is, to a good approximation, a Lambertian surface emitter and is therefore particularly suited to be used in a headlight.

In principle, however, the invention is not restricted to use of the semiconductor layer sequence in a thin-film light-emitting diode chip, but rather can be used, in principle, wherever microstructured surfaces are required on an epitaxially produced semiconductor layer sequence which is detached from the growth substrate.

The radiation-emitting semiconductor chip according to the application, which can be a thin-film light-emitting diode chip, for example, can be contained, in particular, in an optoelectronic component.

For making contact with the semiconductor chip, the latter can have a contact pad, in particular a contact metallization for electrically connecting the semiconductor layer sequence, on the microstructured outer surface. Conventionally known metallization layers are suitable for this purpose. Alternatively, however, contact-making can also be effected from the opposite side of the semiconductor layer sequence relative to the microstructured side, which then makes possible a flip-chip design.

BRIEF DESCRIPTION OF THE DRAWINGS

Further advantages and advantageous embodiments and developments of the invention will become apparent from the embodiments described below in conjunction with the figures. In this case, identical or identically acting constituent parts are provided with the same reference signs. The sizes of the constituent parts and the size relationships of the constituent parts and in particular of the layers among one another should not be regarded as true to scale.

DETAILED DESCRIPTION OF ILLUSTRATIVE EMBODIMENTS

Figure 1A:
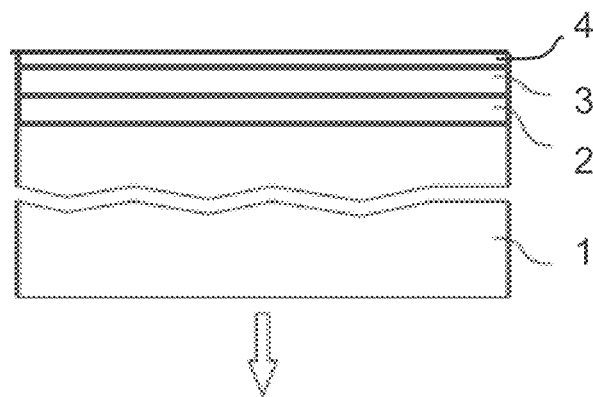
FIGS. 1A to 1F show a schematic illustration of a method sequence for producing a radiation-emitting semiconductor chip.
Figure 1B:
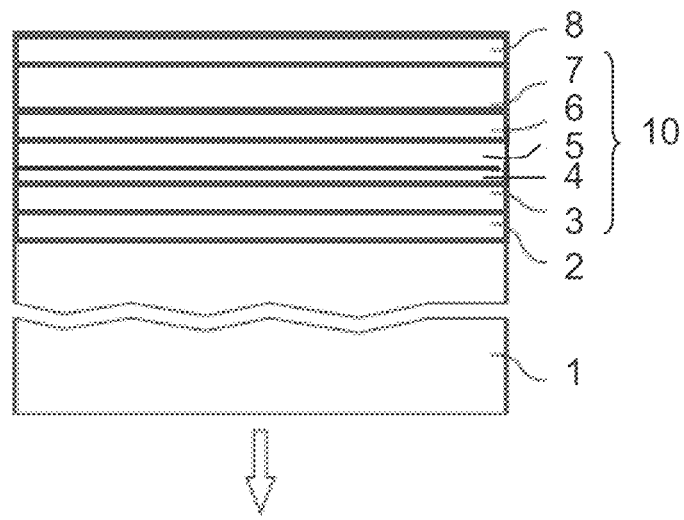
Figure 1C:
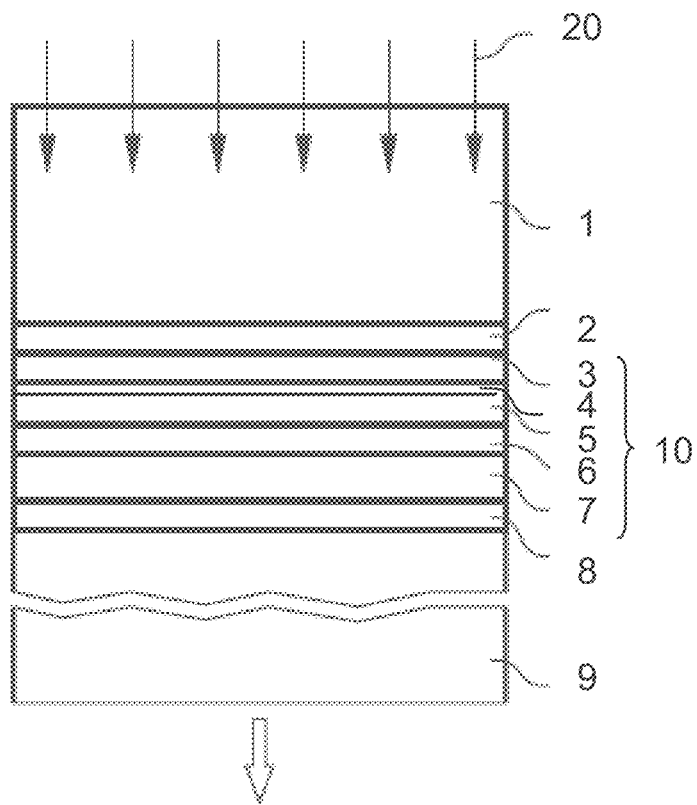

The method sequence illustrated schematically in FIGS. 1A to 1F involves firstly growing on a growth substrate 1, for example, composed of sapphire, SiC or Si, by means of MOVPE, a GaN buffer layer 2, which can optionally also be Si-doped, and an Si-doped GaN contact layer 3. During the growth of the epitaxial layer sequence by means of MOVPE, in this case the 000-1 crystal face (N-face of the hexagonal nitride lattice) usually faces the sapphire growth substrate. Onto the contact layer 3, which is generally designated as "first layer of the semiconductor layer sequence" in the context of the present application, a silicon nitride layer as etching stop layer 4 having a thickness of 0.5 nm is subsequently produced by means of MOVPE from silane and ammonia (cf. FIG. 1A). Alternatively, for example, a silicon oxide or magnesium nitride layer can also be deposited. Further semiconductor layers are subsequently applied to the etching stop layer 4 by means of MOVPE. These are, in particular, (a) an Si-doped GaN cover layer 5, (b) a layer 6 which generates electromagnetic radiation (in particular green or blue light) and has a multiquantum well structure having a plurality of InGaN quantum wells and GaN barriers situated between the latter, and (c) a p-doped AlGaN cover layer 7 (cf. FIG. 1B). A further p-doped GaN layer can also succeed the cover layer 7 (not shown).

A metallic mirror layer 8 is subsequently applied to the semiconductor layer sequence 10, which mirror layer can reflect electromagnetic radiation generated in the active layer 6 back into the semiconductor layer sequence 10 or in the direction of the later microstructured outer surface. By way of example, silver or aluminum is suitable as mirror material (cf. FIG. 1B).

The semiconductor layer sequence is subsequently connected by the mirror side to an electrically conductive carrier body 9, which can be formed for example from silicon, gallium arsenide, germanium or molybdenum. This can be effected, for example, by means of eutectic bonding, soldering or adhesive bonding. The sapphire substrate 1 can subsequently be separated by means of a laser lift-off method, which is indicated by the arrows 20 in FIG. 1C. In this case, the buffer layer 2 is decomposed in such a way that gaseous nitrogen arises; if appropriate, residues of metallic gallium can in this case remain on the surface (not shown). A corresponding laser lift-off method is described, for example, in International Patent Publication No. WO 98/14986 A1, to the disclosure content of which in this regard in its entirety reference is made. By way of example, a laser radiation source having a wavelength in the range of between 350 nm and 360 nm or having a shorter wavelength can be used as radiation source for the laser lift-off method.

Figure 1D:
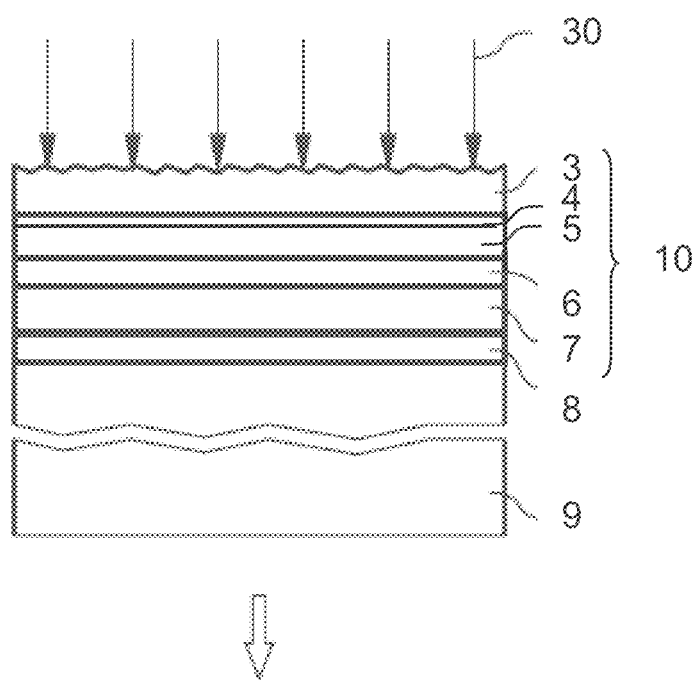

The residual contact layer 3 is subsequently subjected to an etchant 30, which etches in a manner that removes GaN material (cf. FIG. 1D). Alkali hydroxide solution is preferably used as etchant in this case. By way of example, etching can be effected using KOH in a 30% strength solution at a temperature of approximately 70° C., the etching time being approximately 10 minutes.

Gallium residues are usually also removed by this etchant. If appropriate, however, for this purpose it is also possible to use a pre-etching step using, for example, KOH in a significantly more dilute form as etchant.

Figure 1E:
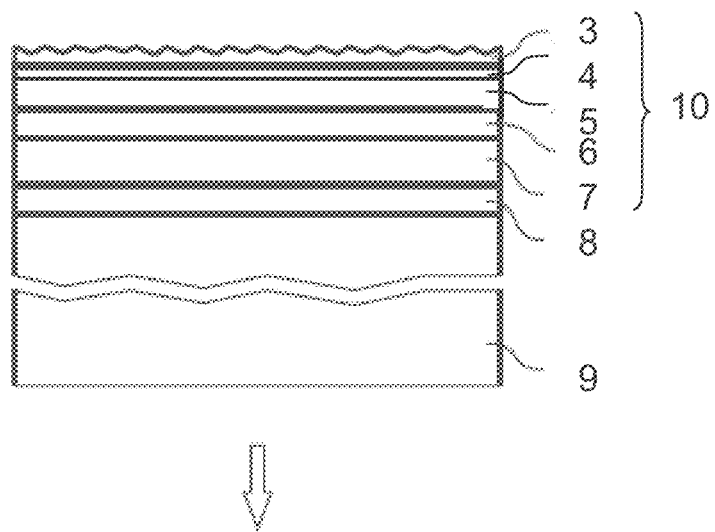

Different crystal facets of the contact layer 3 are exposed by the etching step (cf. FIG. 1E). The etchant predominantly etches at the crystal defects. In this respect, corresponding etching traces can be detected at the transition between two structure elements of the microstructured outer surface that are produced by the etching, in particular at polyhedra formed. These etching traces result from the different etching behavior of the 000-1 crystal faces and adjoining crystal faces, which occur, in particular, in the region of such transitions. The presence of 000-1 crystal faces or of the N-face can be detected by means of X-ray spectroscopy. In contrast to polyhedra which are grown by epitaxy, the structuring obtained by the method according to the application therefore has etching traces in particular in the region of the faces which are not 000-1 crystal faces.

In the example outlined, the entire buffer layer 2 is decomposed during the laser lift-off method, such that it constitutes a separating zone or separating layer. Alternatively, the buffer layer 2 and the laser lift-off method can be coordinated with one another such that only a part of the buffer layer 2 or a part of the contact layer 3 is decomposed.

The microstructuring of the contact layer 3 produces a roughening on a scale corresponding to the blue spectral range of the visible spectrum of electromagnetic radiation. The roughening structures, are, in particular, of the order of magnitude of half an internal wavelength of the electromagnetic radiation generated in the active semiconductor layer.

Figure 2:
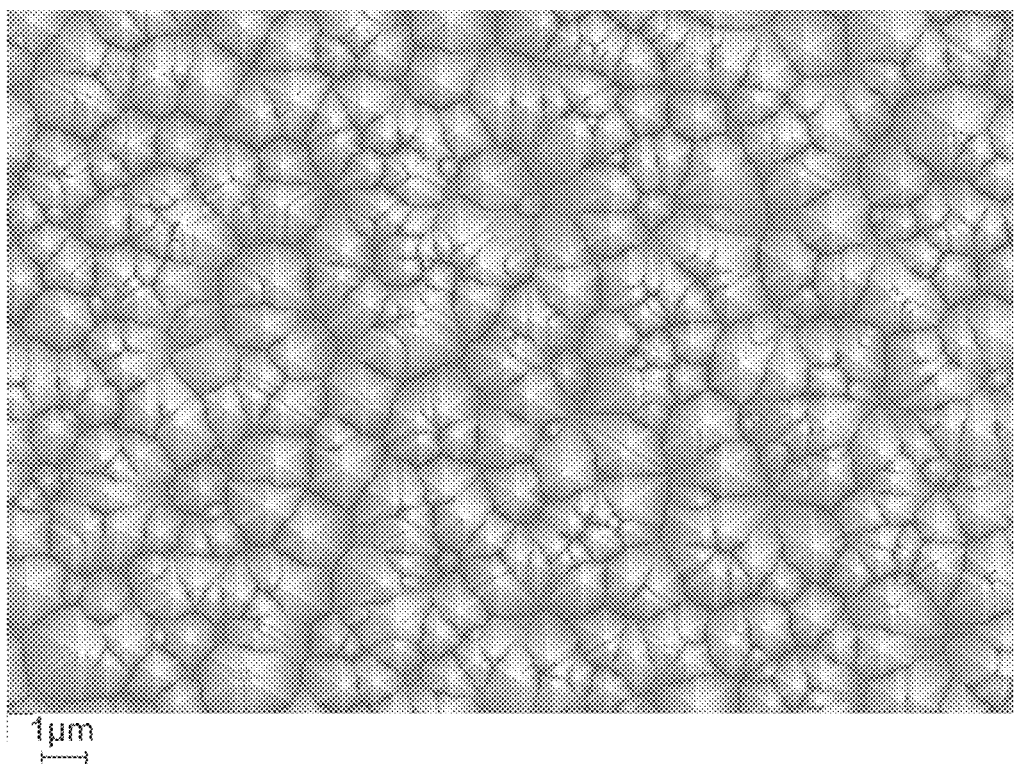
FIG. 2 shows an SEM micrograph of a microstructured semiconductor surface.
Figure 3A:
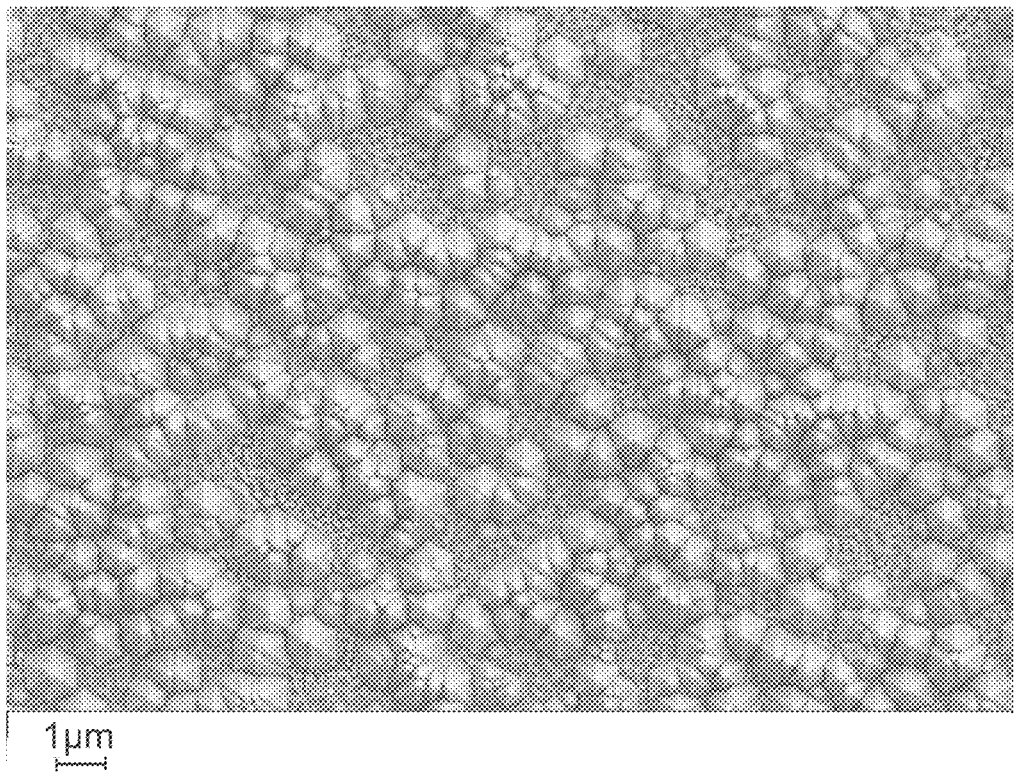
FIGS. 3A and 3B show SEM micrographs of a microstructured semiconductor surface with a recording angle of 90° and 60°.
Figure 3B:
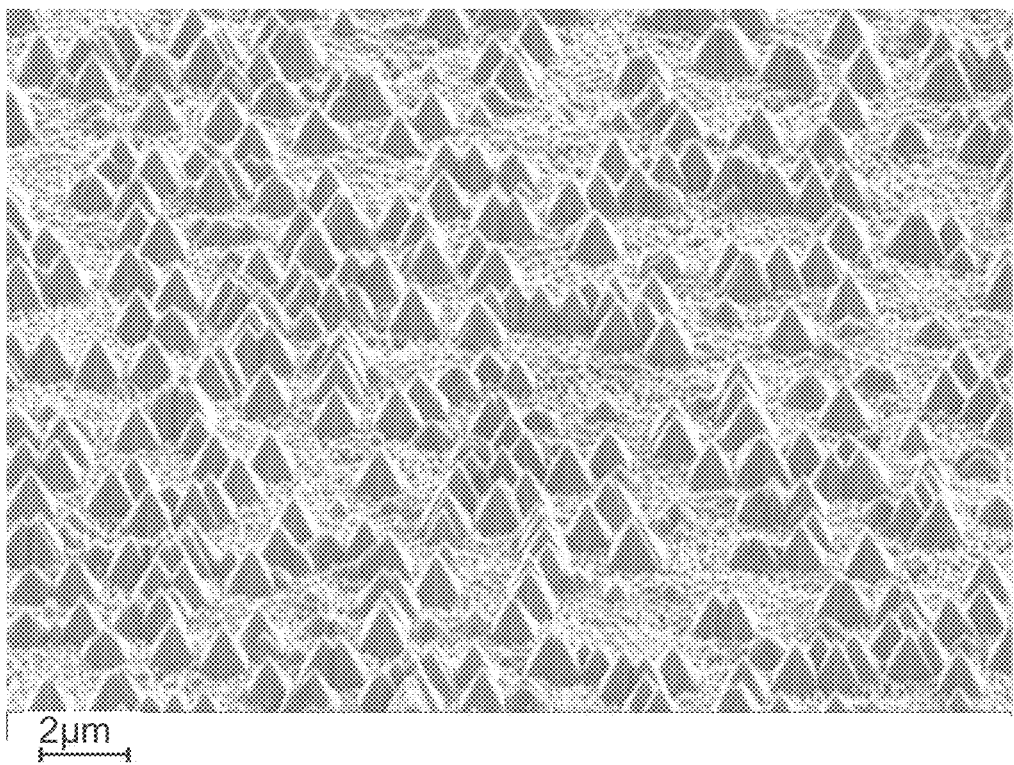

FIG. 2 shows a surface of a contact layer 3 composed of GaN after an etching step using 30% strength KOH solution at approximately 70° C., in which the time of action is 10 minutes and is optimally coordinated with the thickness of the cover layer, such that a substantially complete coverage of the surface with crystal facets results and the etching stop layer 4 situated below the microstructured surface is not visible. For comparison purposes, the etching step was carried out under the same conditions as indicated above for a significantly longer time, for example, approximately 14 minutes. It is found that the etching stop layer 4 then also becomes partly discernible as a result of longer etching between micro structured surface regions of the contact layer 3. This is shown even more clearly than FIG. 3A by the SEM micrograph in FIG. 3B, in which the individual polyhedra of the microstructuring are clearly visible and between them are unstructured regions in which, therefore, the etching stop layer 4 is visible.

In order to improve the roughening effect, the contact layer 3 can have, at least in the region adjoining the buffer layer 2, an increased defect density in comparison with the subsequent layers 5, 6 and 7. Furthermore, the contact layer 3 can have a silicon dopant concentration of $1\times10^{18}$ cm$^{-3}$ to $1\times10^{19}$ cm$^{-3}$ at least at the side facing toward the buffer layer. This makes the simple production of an ohmic contact on the contact layer 3 possible.

An electrical connection can subsequently be applied (FIG. 1F) to the semiconductor layer sequence illustrated in FIG. 1E having a microstructured surface, in particular composed of (GaN) polyhedra. By way of example, a bonding pad 11, in particular a bonding pad metallization, for electrically connecting the n-side of the semiconductor layer sequence 10 is applied for this purpose.

A contact layer 12 for electrically connecting the light-emitting diode chip is applied on that side of the carrier body 9 which faces away from the semiconductor layer sequence 10 before or after the connection of said carrier body to the semiconductor layer sequence 10.

Figure 1F:
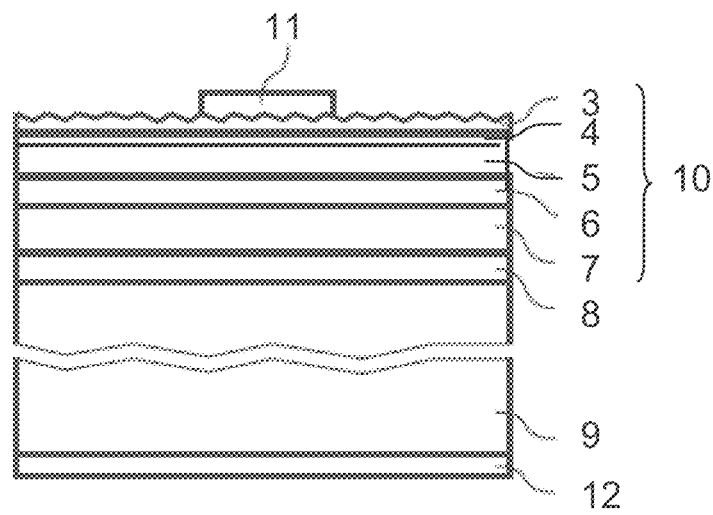

The embodiment illustrated in FIG. 1F can alternatively also be replaced by an embodiment suitable for flip-chip mounting. In this case, no contact 11 is situated on the cover layer; rather, the n-contact is effected by means of vias, i.e., from the carrier body side 10.

The invention is not restricted to the exemplary embodiments by the description on the basis of said exemplary embodiments. Rather, it encompasses any novel feature and also any combination of features, even if this feature or this combination is not explicitly specified in the exemplary embodiments or patent claims.

The invention claimed is:

1. A method for producing a semiconductor layer sequence based on nitride compound semiconductor material and having a microstructured outer surface, the method comprising: growing a first semiconductor layer of the semiconductor layer sequence on a substrate; applying an etch stop layer on the first semiconductor layer in a manner that the etch stop layer completely covers the first semiconductor layer, the etch stop layer comprising silicon dioxide, silicon nitride, or magnesium nitride, and the etch stop layer having a thickness between 0.4 and 2 nm, inclusive; growing a further semiconductor layer on the semiconductor layer sequence obtained after applying the etching step layer, wherein the etch stop layer is configured to prevent etching of the further semiconductor layer; separating the semiconductor layer sequence from the substrate by at least partially removing a separating zone of the semiconductor layer sequence; and etching an obtained separating surface of the semiconductor layer sequence by use of an etchant, such that a microstructuring of the first semiconductor layer is effected and the microstructured outer surface is formed.

2. The method according to claim 1, wherein the first semiconductor layer of the semiconductor layer sequence comprises a material of the formula $In_xAl_yGa_{1-x-y}N$ where $0 \leq x \leq 1$, $0 \leq y \leq 1$ and $x+y \leq 1$.

3. The method according to claim 1, wherein the first layer of the semiconductor layer sequence comprises $In_xGa_{1-x}N$ where $0 \leq x \leq 1$.

4. The method according to claim 1, wherein the etchant comprises alkali hydroxide or an acid.

5. The method according to claim 1, wherein different crystal facets are exposed by etching the obtained separating surface.

6. The method according to claim 1, wherein a semiconductor material of the first semiconductor layer is grown onto the substrate such that an N-face of a nitride lattice faces the substrate.

7. The method according to claim 1, wherein separating the semiconductor layer sequence is performed by a laser lift-off method.

* * * * *

UNITED STATES PATENT AND TRADEMARK OFFICE
CERTIFICATE OF CORRECTION

PATENT NO.       : 9,337,388 B2
APPLICATION NO.  : 13/878212
DATED            : May 10, 2016
INVENTOR(S)      : Hertkorn et al.

Page 1 of 1

It is certified that error appears in the above-identified patent and that said Letters Patent is hereby corrected as shown below:

On the Title Page, item (75) Inventors, line 3, delete "Regensnburg (DE)" and insert --Regensburg (DE)--.

In the Claims

In Col. 11, line 24, claim 1, delete "the etching step layer," and insert --the etch stop layer,--.

Signed and Sealed this
Sixteenth Day of August, 2016

Michelle K. Lee
*Director of the United States Patent and Trademark Office*